United States Patent [19]

Eziri et al.

[11] Patent Number: 5,407,614
[45] Date of Patent: Apr. 18, 1995

[54] PROCESS OF MAKING PITCH-BASED CARBON FIBERS

[75] Inventors: Hiroshi Eziri; Hidekazu Saito; Tetsuo Yamada, all of Ibarakiken, Japan

[73] Assignee: Petoca Ltd., Tokyo, Japan

[21] Appl. No.: 80,013

[22] Filed: Apr. 20, 1993

Related U.S. Application Data

[63] Continuation-in-part of Ser. No. 614,423, Nov. 16, 1990, abandoned.

[30] Foreign Application Priority Data

Nov. 17, 1989 [JP] Japan ................................ 1-299226

[51] Int. Cl.$^6$ .............................................. D01F 9/12
[52] U.S. Cl. .................... 264/29.2; 264/29.7; 264/211.11; 423/447.1; 423/447.6; 423/447.8
[58] Field of Search ............... 264/29.2, 29.7, 211.11; 423/447.1, 447.6, 447.8

[56] References Cited

U.S. PATENT DOCUMENTS

| | | | |
|---|---|---|---|
| 4,005,183 | 1/1977 | Singer | 423/447.2 |
| 4,014,725 | 3/1977 | Schulz | 156/148 |
| 4,068,037 | 1/1978 | Debolt et al. | 428/368 |
| 4,376,747 | 3/1983 | Nazem | 264/29.2 |
| 4,504,454 | 3/1985 | Riggs | 423/447.1 |
| 4,628,001 | 12/1986 | Sasaki et al. | 428/367 |
| 4,781,908 | 11/1988 | Hara et al. | 423/447.4 |
| 5,114,697 | 5/1992 | Naito et al. | 423/447.1 |

FOREIGN PATENT DOCUMENTS 338212 10/1989 European Pat. Off. .

OTHER PUBLICATIONS

Extended Abstracts and Program; Jul. 18–22, 1983; University of California San Diego;Mesophase, Carbonization and Graphitization;Dr. I. C. Lewis.

1965, vol. 3, pp. 31–38. Pergamon Press Ltd.; On the Carbon Fiber from the Molten Pyrolysis Products; Faculty of Tech., Gumma Univ. Kiryo-Shi, Japan.

*Primary Examiner*—Leo B. Tentoni
*Attorney, Agent, or Firm*—Armstrong, Westerman, Hattori, McLeland & Naughton

[57] ABSTRACT

Carbon fibers are provided essentially consisting of liquid crystal pitch based continuous monofilaments having an average filament diameter of 30 μm or greater. The carbon fibers can have modulus of elasticity of 80,000 Kgf/mm$^2$ or greater and tensile strength of 200 Kgf/mm$^2$ or greater. The carbon fibers can be used as a multifilament fiber consisting of plural monofilaments as in the case of conventional carbon fibers but it is particularly preferable that a number of constituting monofilaments is one.

2 Claims, 1 Drawing Sheet

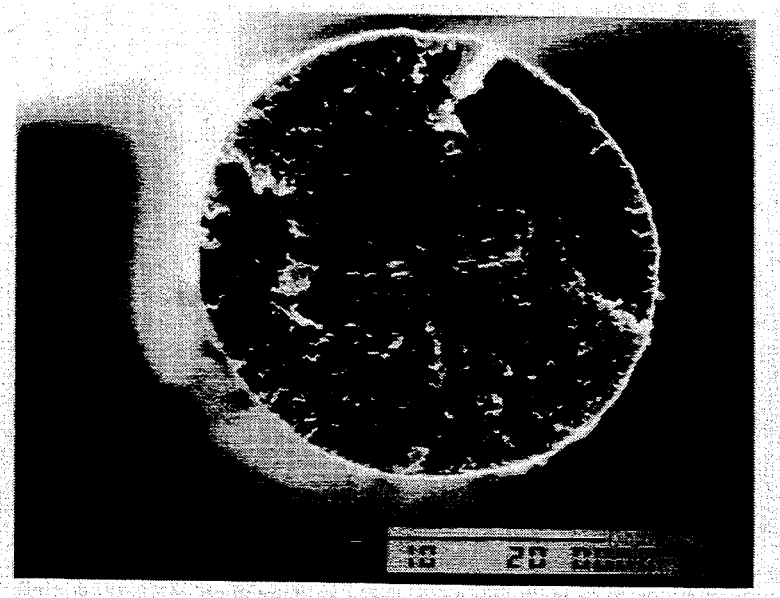

PROCESS OF MAKING PITCH-BASED CARBON FIBERS

This application is a continuation-in-part of U.S. application Ser. No. 07/614,423 filed Nov. 16, 1990, now abandoned.

BACKGROUND OF THE INVENTION

1. Field of the invention

This invention relates to carbon fibers essentially consisting of monofilaments having a large diameter. Further the present invention relates to a liquid crystal pitch based continuous monofilament or continuous carbon fibers essentially consisting of small number of monofilaments. In addition, the "liquid crystal pitch" of the present invention is a general term for the pitch containing an optically anisotropic component and the pitch which is convertible easily to optically anisotropic by heat or stress.

The carbon fibers essentially consisting of large diameter monofilaments can be used for electric conducting material (heat-generating body, electrode material) electromagnetic-wave-shielding material, electric charge-preventing material, heat-resisting material, chemicals resisting material (filtration cloths, working cloths, protecting cloths, protection material, heat insulating materials), etc. Conventional carbon fibers have a drawback of being liable to form fluffs because their constituting monofilaments are thin and the number of the monofilaments is large and the carbon fibers are inconvenient to be treated as raw materials for such industrial materials.

Carbon fibers essentially consisting of large diameter monofilaments take a firm stand and have an advantage of low deformation due to the flow of the matrix component.

Even in the case where matrix materials have an extremely large surface tension such as metals, or have an extremely high viscosity such as certain kinds of thermoplastic resin, the carbon fibers of the present invention have small tendency to move and cause localization by the flow of matrix component. Accordingly, they show superior performance as a reinforcement material for fiber composite materials.

Carbon fibers consisting essentially of a small number of monofilaments, particularly a monofilament show superior performance as a core material of ceramic fibers, etc. produced by way of CVD (Chemical Vapor Deposition) to coat with boron, silicon carbide, silicon nitride, etc.

2. Prior Arts

In case of brittle materials like glass, it is known that strength becomes greater when they are shaped extremely finely. This has been explained from the fact that flaws are formed at a certain probability due to strain, etc. at the time of shaping, but if shaped finely, the probability of the existence of flaws included in the test piece becomes smaller, namely the finer the shaped body is, the greater the strength is improved.

It has been reported heretofore that such a phenomenon exists in case of conventional carbon fibers. In the case of PAN based carbon fibers, since strength becomes greater as diameter of fibers becomes smaller, thinner fibers are prepared in the course of time.

In case of isotropic pitch based carbon fibers, Otani investigated the relation between fiber diameter and strength; he reported that if diameter becomes greater than 10 $\mu$m, strength drops suddenly [Carbon 3, 31–38 (1965)]. In case of mesophase pitch based carbon fibers, D. M. Riggs and J. G. Venner reported that the carbon fibers carbonized at 1500° C. or 2000° C. have a strength greater than 450 KSI when a fiber diameter is 8 $\mu$m or less, and as the fiber diameter becomes greater, strength abruptly falls and at a diameter of 13.5 $\mu$m the strength becomes 250 KSI or less (16th Biennial conference of Carbon).

From such a status, it has not been heretofore expected to produce a liquid crystal pitch based carbon fiber monofilament particularly a continuous monofilament.

Heretofore, synthetic fiber monofilaments have been produced by a process in which, after a spinning solution is extruded from a spinning nozzle and is solidified, stretching, heat treatment is successively carried out, and further fibers are continuously wound up after dividing into every monofilament or every several monofilaments.

This method is simple and does not require high grade of art but accuracy of quality of products are superior and this method is used for many synthetic resins such as, polyamide, polyester, polyolefin, etc.

Further in case for fibers having a large strength and elongation, such as polyamide, a method is also used in which filament yarns having relatively large monofilament denier is wound up while being detwisted and divided one by one or two by two monofilaments.

In case of pitch fibers, the strength of monofilament after spinning (extrusion) is drastically low and hence it is difficult to adopt these methods. The pitch fibers after spinning are wound up immediately after collection in bundles or their being picked up in cans or on a porous belt. The pitch fibers are subjected to infusibilization and carbonization while being kept in the state of being-;wound up on a bobbin, in the state accommodated in cans or on a belt to avoid injury. It is natural that rough working such as fiber dividing cannot be put into practice unless the fibers are in the state of advanced carbonization. But even after carbonization it is extremely difficult in the point of strength as well as technique to divide the carbon fibers in which a large number of fine monofilaments are collected in bundles and carbonized into continuous monofilaments.

Problem to be Solved by the Invention

Since the principal application of conventional carbon fibers is reinforcement of a composite material, the demand for fibers consisting of small number of monofilaments such as fibers for clothing has been extremely small.

However, recent improvement of quality of carbon fibers has been advanced, and their unique physical properties have become attracting attention as fibers for industrial materials. On this account, there has been a tendency toward rapid increasing demand for carbon fibers having the same extent of thickness as traditional synthetic fibers.

For fulfilling such a new demand for carbon fibers, a monofilament having high modulus of elasticity and tensile strength is necessary. However, it has been known that if the diameter of a monofilament becomes greater than about 10 $\mu$m there is a problem that strength is reduced rapidly.

In order to solve this problem, study has been made about the production condition of monofilaments whereby a liquid crystal pitch based carbon fiber which shows high modulus of elasticity and which does not show great change of strength even when the diameter of monofilaments changes. These have been found and the present invention is directed to such fibers.

BRIEF DESCRIPTION OF THE DRAWING

FIG. 1 is an electron micoscopic photograph of the monofilament cross-section of the present invention.

DETAILED DESCRIPTION OF THE INVENTION

The present invention resides in carbon fibers essentially consisting of liquid crystal pitch based continuous monofilaments having an average filament diameter of 30 μm or greater.

The carbon fibers of the present invention can have modulus of elasticity of 80,000 Kgf/mm$^2$ or greater and tensile strength of 200 Kgf/mm$^2$ or greater.

The carbon fibers of the present invention can be used as a multifilament fiber consisting of plural monofilaments as in case of conventional carbon fibers but it is particularly preferable that the number of constituting monofilaments is one.

The carbon fibers of the present invention are produced from liquid crystal pitch which has a relatively high softening point and a narrow molecular weight distribution, preferably having a softening point of 270°–360° C., and produced from petroleum based pitch having a content of optically anisotropic component of 85–100%. When a pitch having a softening point lower than 270° C. is used, the viscosity of melted product is lower, it becomes difficult to spin fibers having a large fiber diameter and when the quantity of a lower molecular weight component becomes large, there is a problem that defects in carbon fibers increase and strength is reduced. Accordingly, it is preferable to remove a low molecular weight component by way of reduced pressure treatments or the like. In case of use of a pitch having a softening point of 360° C. or greater, there is a problem that draw-resonance is liable to occur at the time of spinning and production of fibers having a uniform diameter becomes difficult.

At the time of production of a liquid crystal pitch, it is one of the effective methods to heat treat a pitch from which components liable to turn to high molecular weight and foreign matters, etc. having been removed by separating mesophase pitch formed during a preliminary heat treatment of a raw pitch. When the content of optically anisotropic component becomes smaller, reduction of fiber strength accompanied by the increase of fiber diameter becomes greater, and further if optically isotropic component increases, spinnability is lowered and not preferable. It is preferable that the content of the optically anisotropic component is more than 85% and essentially 100% is particularly preferable.

As liquid crystal pitch, besides optically anisotropic pitch having a common flow pattern, it is possible to select from among pitches which are convertible easily to optically anisotropic, those pitches are produced by solvent extraction from heavy oil or pitches or by converting optically anisotropic pitches to isotropic pitches by reduction, etc. As a heavy oil or pitches those based upon petroleum type is particularly preferable.

In the production of carbon fibers of the present invention, a spinning velocity (or a winding up velocity) is 35 m/min. or lower, preferably 30 m/min. or lower. When the spinning velocity is higher than 35 m/min., the filament diameter tends to be uneven. Further, it is preferable to do spinning of melted pitch from spinning holes having enlarged cross-section toward the down stream direction. One advantage of the use of such spinning holes is to enlarge the pressure reduction at spinning holes and to make the delivery amount of pitch from each spinning hole uniform. Another advantage is a capability of changing orientation of pitch molecules from easily splittable radial type to less easily splittable random type or folded radial type.

In case of fibers of large monofilament diameter as in the present invention, as shown in FIG. 1, it has been found that a specified three layers structure is liable to be formed in which surface layer and central parts are radial and its middle parts are random. Further it is recognizable that the lower the spinning velocity, the higher the modulus of elasticity of carbon fibers produced.

At the time of spinning of pitch fibers of large monofilament diameter as in the present invention, uniform cooling is also one of the important conditions and if cooling becomes non-uniform, non-uniformity of monofilament diameter is liable to be brought about by draw resonance.

In the production of carbon fibers in the present invention, it is necessary to make a heating rate slower at the time of infusibilization of pitch fibers. It is preferable to treat at a heating rate of 1.0° C./min. or less in a heated air. If the heating rate is too great, infusibilization in the central part of fibers becomes insufficient and since weak points are formed by foaming, this is not preferable. Further if the heating rate is too small, this is not preferable because of increase of cost. The heating rate is preferably in the range of 0.01°–0.5° C./min.

At the time of infusibilization of the pitch fibers of the present invention, also, it is possible to promote infusibilization reaction by conventional means such as a treatment in the heated air where oxygen concentration is elevated.

For the carbon fibers of the present invention, it is preferable to do treatment at a lower heating rate than that of conventional carbon fibers in the early stage of the carbonization. Particularly, the heating rate in the temperature range of higher than 600° C. is preferably 100° C./min. or less, and more preferably it is 30° C./min. or less.

It is preferable that in the present invention, the pitch fibers having been melt-spun are immediately wound up or accommodated in cans or on a porous belt and are subjected to infusibilization and carbonization treatment, then the resulting carbon fibers are presented to various processing. The pitch fibers immediately after meltspinning are extremely weak and brittle even though their diameter is large, it is necessary to pay the maximum attention in treating in the form of one or several ends of monofilament. However, after it is subjected to infusibilization and carbonization treatment, strength becomes greater, brittleness becomes less and handling as a common yarn having one or several ends of monofilament becomes possible.

At this step, it becomes possible to divide a thick fiber bundle into a plurality of fiber bundle having nearly the same number of monofilament ends and thus thin multifilament yarns or monofilament can be produced according to this process. In this case, preferably, treatment is carried out while the number of monofilaments is relatively large during the time from the production of pitch fibers until the early stage carbonization by which brittleness becomes less. Thereafter by dividing into a plural number of fiber bundles having nearly equal number of monofilaments, it is possible to produce the carbon fibers essentially consisting of small number of monofilaments or a monofilament.

In case of conventional carbon fibers, it was believed that if diameter of a monofilament becomes greater there is tendency that strength becomes smaller but in case of carbon fibers of the present invention, this tendency is not notable, it is possible to make tensile strength to 200 Kgf/mm$^2$ or greater and modulus of elasticity of 80,000 Kgf/mm$^2$ or greater.

On the one hand, if diameter of monofilament becomes greater, since friction resisting property is increased, in case where the fiber assembled body itself is used without being coated with other matrix material, it is preferable that diameter of monofilament is great.

However, if diameter of monofilament becomes greater, infusibilization becomes difficult, low temperature long time oxidation treatment becomes necessary. Further, there is a tendency to be liable to non-uniformity at the time of spinning of pitch fibers. For the above-mentioned reasons, monofilament diameter of the carbon fiber of the present invention is preferably 200 $\mu$m or less, most preferably 150 $\mu$m or less. In the case of PAN based or rayon based carbon fibers, if diameter of monofilament becomes greater, strength is reduced abruptly. The reason of this fact is believed to be that the strength of the fibers depends upon the probability of flaws existing on the surface and with the increase of diameter, the probability of flaw existence becomes greater.

The liquid crystal pitch based carbon fibers of the present invention show less reduction of strength when the diameter of monofilament becomes greater, and have superior characteristic properties in rigidity and shape holding property. Further, since the specific surface area of the carbon fibers of the present invention is smaller, they have an advantage that working by corrosion is easier. Anticorrosion property against the materials such as melted metal which corrode carbon can be obtained by coating the surface with titanium carbide, silicon carbide, etc. and the carbon fibers of the present invention show superior properties as a reinforcement material for composite material in which melted metal is a matrix.

Further by increasing the thickness of the coating layer of these corrosion resisting materials, it is possible to produce fibers in which titanium carbide, silicon carbide, etc. are the principal body of the fiber and it is possible to coat further with boron, silicon nitride, etc.

The carbon fiber monofilaments of the present invention are superior in strength, corrosion resistance, rigidity, shape-holding property, etc. Further when it is used as a fiber-reinforcement material for composite materials, it has an advantage that forming of defects in shaped articles, which is caused by the disorder of fiber disposition or arrangement due to the flow of matrix component at the time of shaping, is smaller.

According to the present invention, the production of liquid crystal pitch based carbon fiber having a diameter of 20 $\mu$m or greater becomes possible but from the viewpoint of the processing property in the later step treatment, liquid crystal pitch based carbon fibers having a diameter of 30 $\mu$m or greater is preferable.

In the production of the carbon fibers of the present invention by fiber dividing, pitch fiber is wound up while shaping in thin plate shape, infusibilization and carbonization are carried out successively while holding the said thin plate shape. At the time of shaping, winding is carried out in such a way that thin plate shape does not turn over or disunite by adhering paste agent or an oiling agent having good bundling property.

At the time of this winding up, it is preferable to use a traverse guide of winding up machine, which has such a narrow opening that shift of relative position of monofilaments does not occur. This opening may be formed as a shape of guide or further it may also be a combination of flattening apparatus of fiber bundle and broad guide. This opening of traverse guide is preferably smaller than twice the fiber diameter.

This thin plate shape fiber bundle which has been wound up is wound out so as not to be turned over or disunite and is divided into carbon fibers of the present invention. In this case, it is also possible to continuously perform steps from spinning of pitch to carbonization without winding up. However, since the preferable treatment velocity in each step is different, it is preferable to wind up after spinning of pitch.

Function

The present invention resides in liquid crystal pitch based carbon fibers essentially consisting of continuous monofilaments having a large filament diameter which is superior in strength and modulus of elasticity.

Though the reason why such carbon fibers can be obtained is not clear, by the synergistic effect of the use of liquid crystal pitch having a high softening point and narrow molecular weight distribution and the use of spinning holes in which the cross-section is increased toward the down stream direction, it is inferred that specified fine structure fibers are produced which have high strength and modulus of elasticity even when monofilament diameter is great and which does not contain defect such as cracks after carbonization.

Further, because petroleum-based pitch contains extremely few non-fluidic foreign matters such as carbon particles compared with coal based pitch, it is considered that even when diameter of monofilaments is great, carbon fibers having superior strength can be obtained.

SPECIFIC EXAMPLES

The present invention will be more fully explained by specific examples.

Specific Example 1

A petroleum based raw pitch having a softening point of 318° C. and an optically anisotropic content of 100 % was melt spun using a nozzle having a narrowest part diameter of the spinning hole of 0.1 mm, the diameter of outlet of the spinning hole of 0.25 mm, while blowing nitrogen at a spinning temperature of 29.2° C. The amount of delivery of pitch was 0.054 g/hole.min. and winding up velocity was 30 m/min. The extruded fibers were wound up after oiling at such a traverse velocity that the fibers were closely paralleled with each other. Infusibilization of spun-out fibers was carried out at a heating rate of 0.1° C./min. to 300° C. and holding time at 300° C. of 30 min. Further, at a heating rate of 5° C./min. temperature was elevated to 700° C. and light carbonization was carried out. Consequently, the resulting fibers were continuously fed to a furnace at a maximum temperature of 500° C. and carbonization treatment was carried out at a heating rate of 12° C./min.

The diameter of resulting fibers was about 32 $\mu$m. Tensile strength was 275 Kgf/mm$^2$ and modulus of elasticity was 85,000 Kgf/mm$^2$. When a cross-sectional surface of fibers was observed, a surface layer and the central part was radial type and its middle part was random type as shown in FIG. 1. There was observed no presence of crack, broken parts or voids.

Further, at the time of carbonization at 2500° C., when the heating rate was elevated at 36° C./min., strength was dropped to 198 Kgf/mm² and when at 120° C./min. strength was dropped to 85 Kgf/mm².

Specific Example 2

By using a spinning nozzle providing 100 spinning holes having a diameter of the narrowest part of 0.1 mm and outlet part diameter of 0.25 mm in place of the spinning nozzle of specific example 1 and using the same pitch, pitch fibers were spun at a spinning temperature of 330° C. The amount of delivery of pitch was 5.4 g/min. and winding up velocity was 30 m/min.

Spun-out fibers were collected by using a polyacrylamide based sizing agent and wound up in the tape shaped product of 4 mm width. Wound up tape was subjected to infusibilization treatment as in Specific example 1 and further to carbonization treatment at a maximum temperature of 2700° C. During the treatment, it was taken care so as not to turn over bundle of fibers or so as not to be disunited.

After carbonization treatment, resultant fibers were divided into 10 carbon fibers and wound up. Resultant fibers were multifilaments consisting of about 10 monofilaments having a diameter of about 32 μm and were superior in processability. Tensile strength was 295 Kgf/mm² and a modulus of elasticity of 92,000 Kgf/mm².

Specific Example 3

By using spinning nozzles similar to that of the Specific example I and using petroleum based pitch having various softening points and content of optically anisotropic component, melt-spinning was conducted at a spinning temperature of a softening point +18° C. with changing diameter of fiber. Resulting pitch fibers were subjected to infusibilization and carbonization as in Specific example 1. The softening point, optically anisotropic component of the raw pitch and properties of the resulting fibers are shown in The First Table.

The First Table
Characteristic Property of Pitch and Fibers

| pitch No. | 1 | 2 | 3 | 4 | 5 |
| --- | --- | --- | --- | --- | --- |
| softening point (°C.) | 272 | 281 | 290 | 340 | 358 |
| content of optically anisotropic component (%) | 86 | 93 | 100 | 100 | 100 |
| average diameter of mono filament (μm) | 22 | 28 | 55 | 98 | 147 |
| tensile strength (Kgf/mm²) | 234 | 256 | 264 | 270 | 259 |
| modulus of elasticity (10³ Kgf/mm²) | 81 | 82 | 84 | 91 | 87 |

Specific Example 4

Coal tar pitch was subjected to heat treatment to give small cubic body of mesophase of about 2 %. Filtration was carried out by sintered metal filter having an average hole diameter of 1.2/μm and purified pitch was obtained.

The purified pitch was further subjected to heat treatment to give a softening point of 316° C. optically anisotropic component content of 90 % and quinoline insoluble content of 45 %. Similarly as in Specific example 1, melt-spinning was carried out and infusibilization and carbonization were conducted.

Diameter of resultant carbon monofilament was about 34 μm tensile strength was 220 Kgf/mm² and modulus of elasticity was 81,000 Kgf/mm². This value was superior to conventional carbon fibers having a large diameter but compared with Specific Example 1, both modulus of elasticity and strength are slightly inferior.

Effectiveness of the Invention

The present invention relates to carbon fibers essentially consisting of monofilaments having a large diameter. The present invention is a liquid crystal pitch based continuous monofilament or carbon fibers essentially consisting of small number of the said continuous monofilaments.

Carbon fibers essentially consisting of monofilaments having a large monofilament diameter are used for electric conductive material (heat generating body, electrode material) electromagnetic-wave-shield material, electric charge preventing material, heat-resisting and chemicals resisting material (filtration cloths, working clothes, protecting cloths, preventing material, heat insulation material), etc. Conventional carbon fibers have a drawback of being liable to form fluffs because their constituting monofilaments are thin and the number of the monofilaments is large. The said carbon fibers are inconvenient to be treated as raw materials for such industrial materials.

Carbon fibers essentially consisting of large diameter monofilaments take a firm stand and have an advantage of difficulty of deformation by the flow of matrix component. Even in case where matrix materials have an extremely large surface tension such as metal or have an extremely large viscosity such as a certain kind of thermo plastic resin, since the carbon fibers of the present invention show small tendency to move and localization by the flow of matrix component, they show superior performance as a reinforcement material for fiber composite materials.

Carbon fibers essentially consisting of a small number of monofilaments, particularly a monofilament show superior performance as a core material for ceramic fibers, etc. produced by way of CVD etc. to coat with boron, silicon carbide, silicon nitride, etc.

We claim:

1. A process for producing continuous liquid crystal pitch-based carbon fibers having an average filament diameter of greater than 30 μm to 200 μm comprising
    (1) spinning pitch fibers from a liquid crystal pitch having a softening point of 270°–360° C. and having a content of optically anisotropic component of 85–100% at a spinning velocity of not greater than 35m/min.
    (2) infusibilizing the spun pitch fibers at a heating rate of 0.01° to 1.0° C./min., and
    (3) carbonizing the infusibilized fibers at a heating rate of 5° to 100° C./min. to produce the pitch-based carbon fibers.

2. A process according to claim 1, wherein the carbon fiber is a monofilament.

* * * * *